United States Patent [19]

Mamiya et al.

[11] Patent Number: 5,479,073
[45] Date of Patent: Dec. 26, 1995

[54] DOT CLOCK GENERATOR FOR LIQUID CRYSTAL DISPLAY DEVICE

[75] Inventors: Johji Mamiya, Kunitachi; Hironari Nishino, Fujisawa; Kohnji Ishii, Ohmihachiman, all of Japan

[73] Assignee: International Business Machines Corporation, Armonk, N.Y.

[21] Appl. No.: 316,310

[22] Filed: Sep. 30, 1994

[30] Foreign Application Priority Data

Sep. 30, 1993 [JP] Japan .................................. 5-245098

[51] Int. Cl.$^6$ .................................................. G09G 3/10
[52] U.S. Cl. .................................. 315/169.3; 315/169.4; 375/373; 375/376; 348/500; 345/100
[58] Field of Search ........................... 315/169.3, 169.4; 358/148; 375/119, 120; 359/36; 331/DIG. 2; 329/325; 345/98, 99, 100

[56] References Cited

U.S. PATENT DOCUMENTS

| | | |
|---|---|---|
| 3,769,602 | 10/1973 | Griswold . |
| 3,895,372 | 7/1975 | Kaji et al. ............................ 345/100 X |
| 4,574,315 | 3/1986 | Yoshimura ........................... 315/169.3 |
| 4,893,319 | 1/1990 | Ziuchkovski . |
| 5,019,807 | 5/1991 | Stapleton et al. .................... 315/169.3 |
| 5,066,893 | 11/1991 | Osada et al. ......................... 315/169.3 |
| 5,359,343 | 10/1994 | Nakamura ........................... 345/100 X |

FOREIGN PATENT DOCUMENTS

0522181A1  1/1992  European Pat. Off. .

*Primary Examiner*—Robert J. Pascal
*Assistant Examiner*—Reginald A. Ratliff
*Attorney, Agent, or Firm*—Ronald L. Drumheller

[57] ABSTRACT

To generate a dot clock for a liquid crystal display device from a horizontal sync signal with reduced skew, a phase locked loop (PLL) is divided into three functional parts. The first part generates a particular frequency by supplying voltage from a latch type DAC (digital/analog converter) to a VCO (voltage controller oscillator). A horizontal sync signal is estimated from the dot clock signal that is finally generated and the output value of the DAC is increased or decreased in accordance with the difference between this estimated horizontal sync signal and the actual horizontal sync signal. This increase or decrease correction is made at, for example, the vertical sync timing. The second part achieves synchronization. A signal corresponding to the phase error between the actual horizontal sync signal and the dot clock signal is added to the signal from the DAC to control the phase of the dot clock. The third part is a PLL for generating the dot clock in accordance with the signal generated by the first part at the particular frequency.

12 Claims, 4 Drawing Sheets

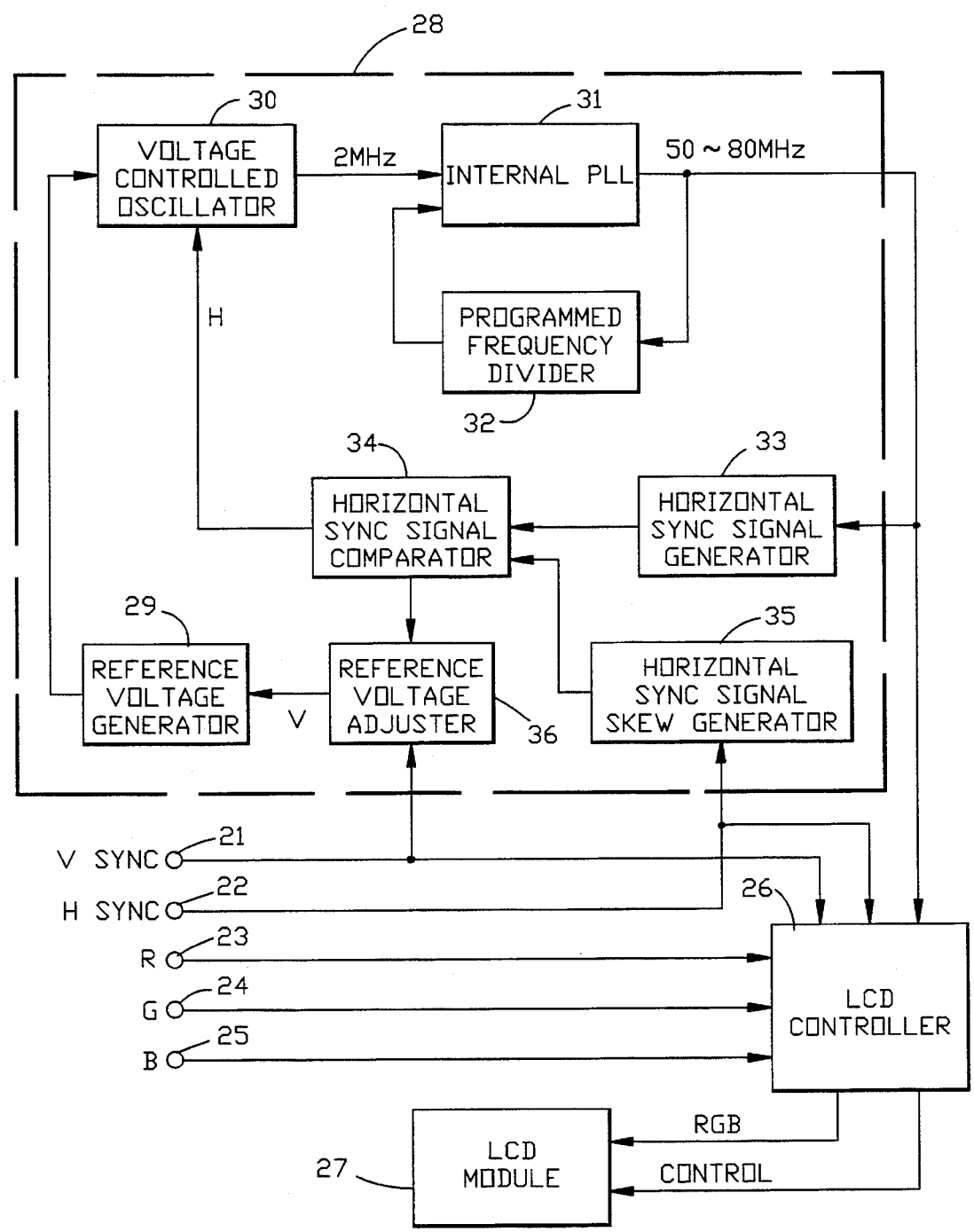

5,479,073

DOT CLOCK GENERATOR FOR LIQUID CRYSTAL DISPLAY DEVICE

BACKGROUND OF THE INVENTION

1. Field of the Invention

The present invention generally relates to a dot clock generator for a liquid crystal display device, and more particularly to such generator which can generate a dot clock with less skew from a sync signal.

2. Related Art

The CRT (cathode ray tube) has been widely used as a monitor of a personal computer, and the interface between the personal computer and CRT is made unique to the CRT. Specifically, R, G, and B analog signals, and vertical and horizontal sync signals are generated in the personal computer unit and provided to the CRT. When a liquid crystal display device is used instead of a CRT in a computer system employing such interface, the liquid crystal display device needs to generate an additional dot clock. In other words, the liquid crystal display device needs to receive R, G, and B digital signals for every dot timing (dot clock) to drive the liquid crystal panel based on these signals. Since the personal computer unit outputs only the analog RGB and sync signals to the above CRT interface, it is necessary to generate a dot clock from the sync signals and, according to the timing of this clock, convert the analog RGB signals to digital RGB signals by the A/D conversion.

A phase locked loop (PLL) circuit shown in FIG. 1 may be used to generate a dot clock from a sync signal, i.e. horizontal sync signal. In FIG. 1, phase comparator 11 is supplied with the horizontal sync signal and the output of frequency divider 12. The comparison outputs (positive and negative) of phase comparator 11 is inputted to voltage controlled oscillator (VCO) 15 via filter 13 and capacitor 14. Then the output of VCO 15 is given as a dot clock and fed back to frequency divider 12. Assuming that frequency divider 12 has a division ratio of 1/N, the dot clock to be outputted will have a frequency of N times the horizontal sync signal.

In the above conventional arrangement, however, a problem arises that the screen is disturbed by the jitters of the dot clock due to the jitters of the horizontal sync signal itself, the beat between the jitters of the horizontal sync signal, and the circulation of power supply noise into VCO 15.

In addition, with such arrangement, the noise from frequency divider 12 is superimposed on the voltage across capacitor 14, leading to a difficulty in generating a stable dot clock necessary for the liquid crystal display. If the phase of frequency divider 12 is delayed with respect to the horizontal sync signal, i.e. if the clock frequency is too low, the voltage across capacitor 14 would increase to increase the clock frequency for compensation, as shown in FIG. 2A. On the other hand, if the phase of frequency divider 12 is advanced with respect to the horizontal sync signal, i.e. if the clock frequency is too high, the voltage across capacitor 14 would decrease to lower the clock frequency for compensation, as shown in FIG. 2B. However, the voltage across capacitor 14 is subject to the noise from frequency divider 12 which skews the clock frequency to thereby disturb the screen.

SUMMARY OF THE INVENTION

In view of the above, the present invention has an object to provide a PLL mechanism which is capable of generating the dot clock with less skew from the horizontal sync signal.

To achieve the above object, the PLL is divided into three functional parts in accordance with the present invention.

The first part is a means for obtaining a particular frequency. This means is designed such that a latch type DAC (digital/analog converter) supplies a voltage to a VCO. The horizontal sync signal is estimated from the dot clock finally generated, and the value of the DAC is increased or decreased according to the difference between the estimated horizontal sync signal and the actual horizontal sync signal. The compensation by this increase or decrease is made at, for example, the vertical sync timing.

The second part is a synchronization means. A signal corresponding to the phase error between the actual horizontal sync signal and dot clock is added to the signal from DAC to control the phase of the dot clock.

The third part is a PLL means for generating a dot clock according to the signal having the particular frequency mentioned above.

BRIEF DESCRIPTION OF THE DRAWINGS

FIG. 3 shows a block diagram illustrating an embodiment of the present invention.

DESCRIPTION OF THE PREFERRED EMBODIMENTS

Figure 1:
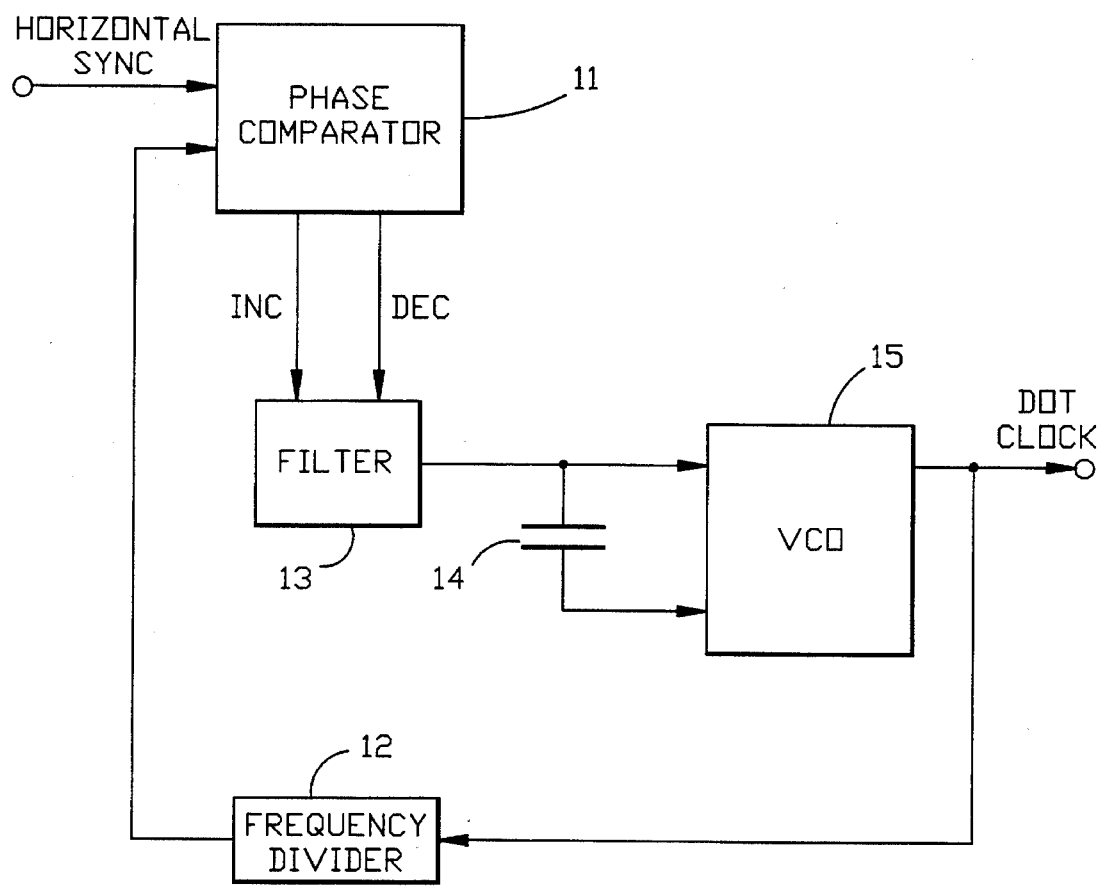
FIG. 1 shows a block diagram illustrating a conventional configuration.
Figure 2A:
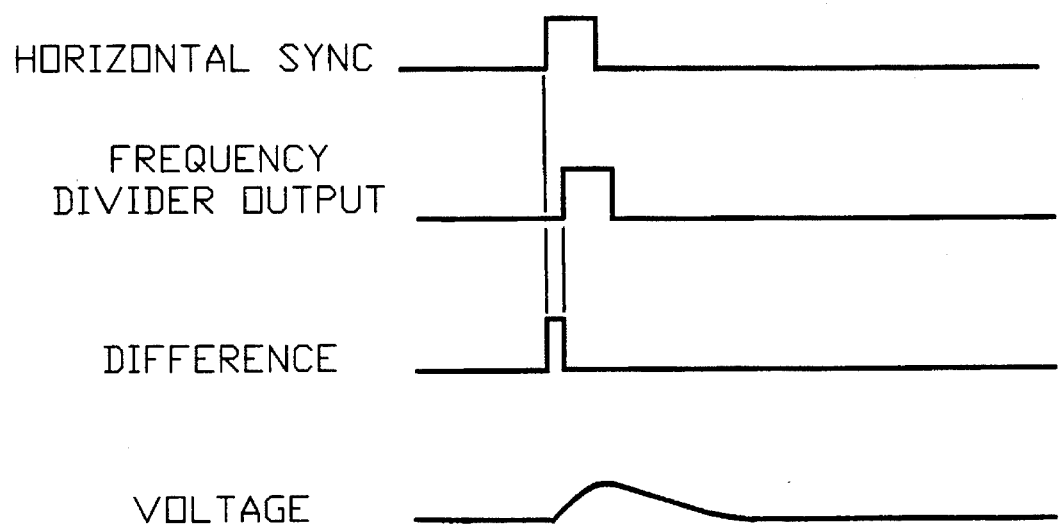
FIGS. 2A and 2B show waveforms illustrating the problem of the conventional configuration.
Figure 2B:
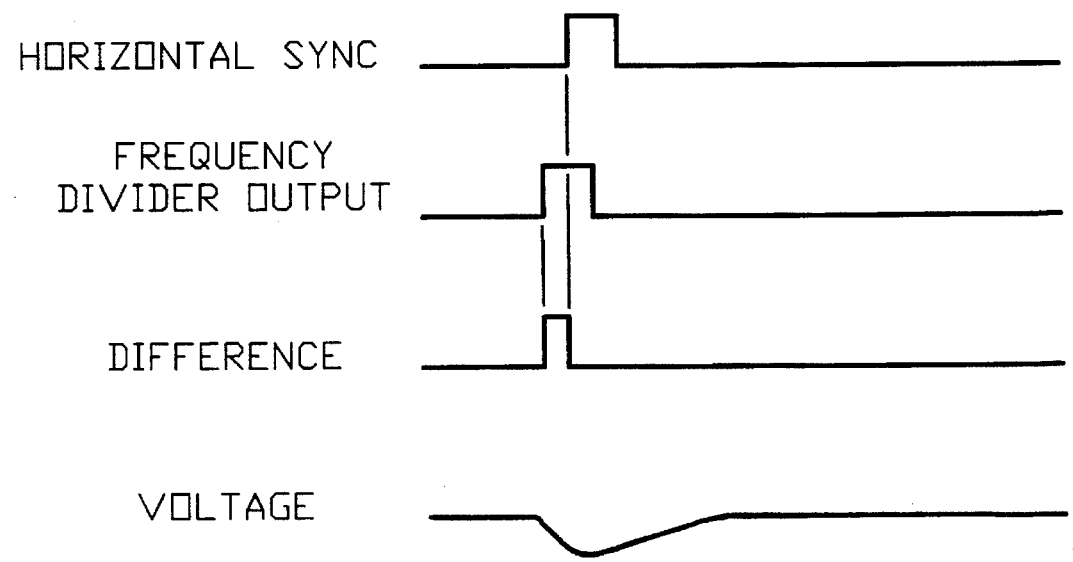

One embodiment of the present invention will be described below with reference to the drawing figures.

FIG. 3 shows the overall configuration of this embodiment in which a vertical sync signal, horizontal sync signal, and R, G, and B video signals are supplied from a personal computer (processing unit) to terminals 21 to 25, respectively. These signals are then supplied to LCD controller 26 which generate R, G, and B digital video signals and other control signals for LCD module 27. In addition to the signals mentioned above, a dot clock is also supplied from dot clock generator 28 to LCD controller 26.

Dot clock generator 28 generates a dot clock, which is variable in a range from 50 to 80 MHz, from the vertical and horizontal sync signals. As described above, the dot clock is used to generate the digital video signal for each dot or pixel.

Dot clock generator 28 includes reference voltage generator 29 and voltage controlled oscillator 30 for a reference clock. Voltage controlled oscillator 30 is provided with a ceramic resonator to generate a reference clock having a 2 MHz center frequency in accordance with the reference voltage from reference voltage generator 29. This reference clock is applied to internal PLL circuit 31 which generates, for example, a 50 to 80 MHz dot clock according to the division ratio of programmed frequency divider 32.

This dot clock is supplied to LCD controller 26 as well as horizontal sync signal generator 33 which counts the dot clock according to its frequency and generates a horizontal sync signal. The generated horizontal sync signal is supplied to horizontal sync signal comparator 34. The comparator 34 also receives a horizontal sync signal from terminal 22 via horizontal sync signal skew generator 35 and compares the phases of both signals. A phase error signal is supplied to voltage controlled oscillator 30 and reference voltage adjuster 36. Voltage controlled oscillator 30 receives the error signal in a horizontal frequency to ensure that the reference clock is in phase with the horizontal sync signal. Reference voltage adjuster 36 receives the error signal in a vertical period to control reference voltage generator 29 to ensure that the reference clock is aligned with the actual horizontal sync signal in the vertical period.

Figure 4:
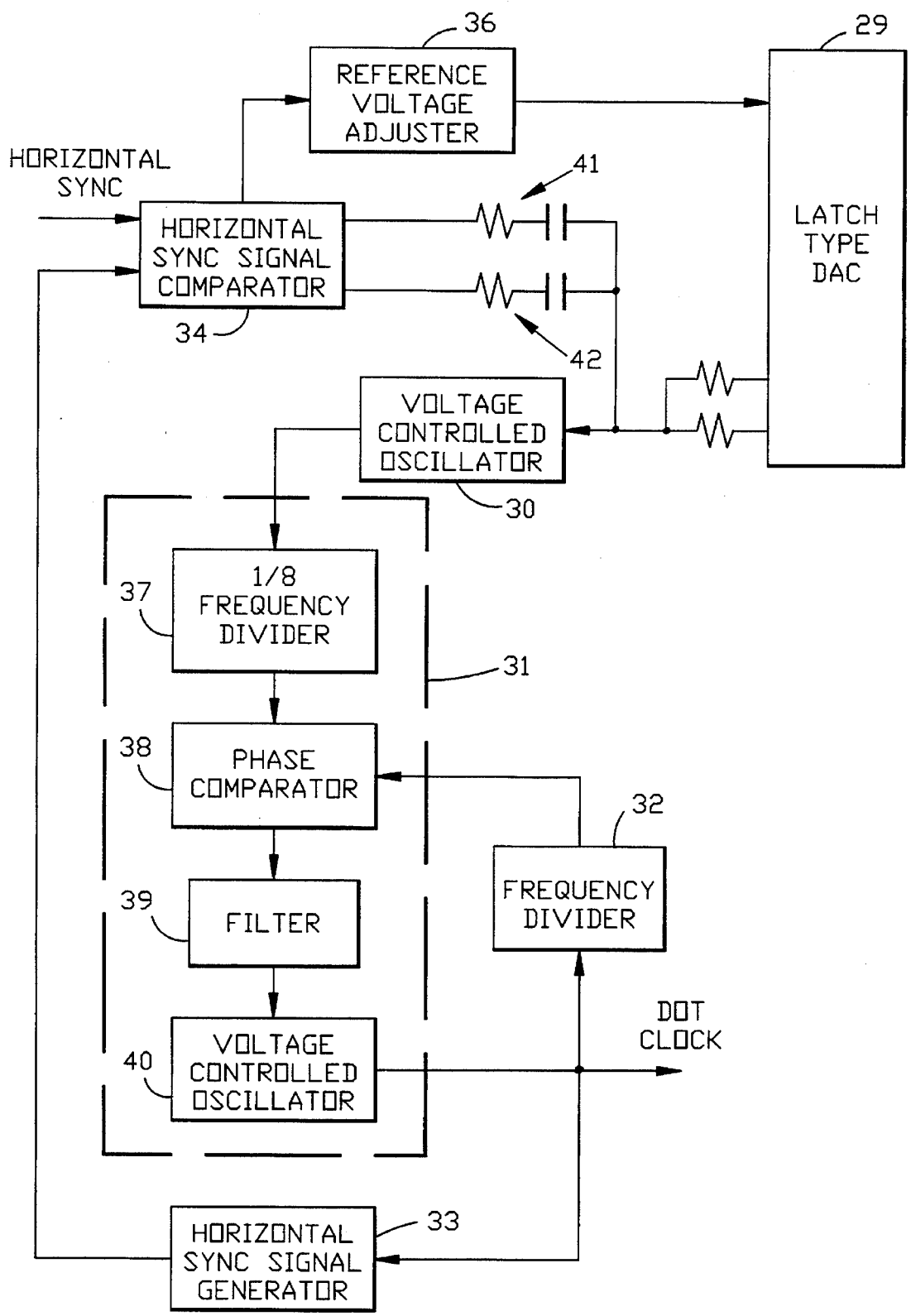
FIG. 4 shows a block diagram illustrating the detailed arrangement of the embodiment shown in FIG. 3.

FIG. 4 shows the details of the major portion of the embodiment shown in FIG. 3. In FIG. 4, elements corresponding to those shown in FIG. 3 are given the same reference numbers. As shown in FIG. 4, reference voltage generator 29 comprises a latch type digital/analog converter (DAC) and supplies the reference voltage to voltage controlled oscillator 30 via resistors. Reference voltage adjuster 36 increments or decrements in the vertical period the latched data of the DAC by a predetermined number, e.g. 1, according to the positive or negative error signal from horizontal sync signal comparator 34 to correct the reference voltage. The error signal is added to the reference voltage in the horizontal period via serial circuits 41 and 42 each consisting of a resistor and a capacitor to ensure that voltage controlled oscillator 30 is in phase with the horizontal signal.

Internal PLL 31 comprises ⅛ frequency divider 37, phase comparator 38, low-pass filter 39, and voltage controlled oscillator 40. A signal of approximately 250 KHz from frequency divider 37 is compared by phase comparator 38 with the signal from programmed frequency divider 32 to allow the frequency or phase of the dot clock to be corrected in an interval of approximately 250 KHz. With this arrangement, the reference clock can be stabilized even with jitters of the horizontal sync signal since the reference voltage is set up in the vertical period. Oscillation can also be stabilized since it is not necessary to alter the reference clock frequency in a wide range and voltage controlled oscillator 30 using the resonator may be used.

Moreover, since the input voltage of voltage controlled oscillator 30 is finely adjusted in the horizontal period in response to the phase error between the horizontal sync signal and dot clock (horizontal sync signal generated from the dot clock), the resulting dot clock is precisely locked to the vertical sync signal.

Internal PLL 31 only divides a stable reference voltage, and the dot clock skew caused by disturbance to this internal PLL 31 is extremely small. Especially, since the comparison period (250 KHz in FIG. 4) of phase comparator 38 in internal PLL 31 is short, the dot clock skew can be corrected with this short period. This not only ensures skew reduction, but also solves a problem of skew accumulated for a long period (horizontal period when the phase error is corrected in the horizontal period). Moreover, although compensation by the feedback of PLL requires several error detections, compensation in this embodiment is completed in a period two or three times of ¹⁄₂₅₀ KHz (4 microseconds), thus being considerably faster in comparison with two or three times the horizontal period (31.5 microseconds).

As described above, in accordance with the present invention, the dot clock skew which impairs the screen can be reduced.

We claim:

1. A dot clock generator for a liquid crystal display device, comprising:

a reference voltage generator means including a latch type digital/analog converter;

a voltage controlled oscillator means which oscillates according to a reference voltage from said reference voltage generator means to produce a reference clock;

a phase locked loop circuit means for producing a dot clock according to said reference clock;

means for producing a horizontal period signal from said dot clock;

means for receiving an external horizontal period signal;

means for detecting a phase error between said horizontal period signal generated from said dot clock and said horizontal period signal received externally;

means for adjusting the latched data of said analog/digital converter according to said phase error in a first period which is longer than said horizontal period; and means for adjusting said reference voltage to be inputted to said voltage controlled oscillator according to said phase error in a second period which is shorter than said first period.

2. A dot clock generator for a liquid crystal display device, as claimed in claim 1, wherein said voltage controlled oscillator means is provided with a resonator.

3. A dot clock generator for a liquid crystal display device, as claimed in claim 2, wherein said first period is a vertical period.

4. A dot clock generator for a liquid crystal display device, as claimed in claim 3, wherein said second period is a horizontal period.

5. A dot clock generator for a liquid crystal display device, as claimed in claim 4, wherein said phase locked loop circuit means has a phase comparator having a reference input which receives a signal whose period is shorter than the horizontal period generated according to said reference clock.

6. A dot clock generator for a liquid crystal display device, as claimed in claim 1, wherein said first period is a vertical period.

7. A dot clock generator for a liquid crystal display device, as claimed in claim 6, wherein said second period is a horizontal period.

8. A dot clock generator for a liquid crystal display device, as claimed in claim 7, wherein said phase locked loop circuit means has a phase comparator having a reference input which receives a signal whose period is shorter than the horizontal period generated according to said reference clock.

9. A dot clock generator for a liquid crystal display device, as claimed in claim 1, wherein said second period is a horizontal period.

10. A dot clock generator for a liquid crystal display device, as claimed in claim 9, wherein said phase locked loop circuit means has a phase comparator having a reference input which receives a signal whose period is shorter than the horizontal period generated according to said reference clock.

11. A dot clock generator for a liquid crystal display device, as claimed in claim 1, wherein said phase locked loop circuit means has a phase comparator having a reference input which receives a signal whose period is shorter than the horizontal period generated according to said reference clock.

12. A liquid crystal display device comprising:

a liquid crystal display element;

a display control means for generating a digital video signal based on analog video and sync signals and providing said digital video signal to said liquid crystal display element;

a reference voltage generator means including a latch type digital/analog converter;

a voltage controlled oscillator means which oscillates according to a reference voltage from said reference voltage generator means to produce a reference clock;

a phase locked loop circuit means for producing a dot clock according to said reference clock;

means for producing a horizontal period signal from said dot clock;

means for receiving a horizontal period signal according to said sync signal;

means for detecting a phase error between said horizontal period signal generated from said dot clock and said horizontal period signal according to said sync signal;

means for adjusting the latched data of said analog/digital converter according to said phase error in a first period which is longer than said horizontal period;

means for adjusting said reference voltage to be inputted to said voltage controlled oscillator according to said phase error in a second period which is shorter than said first period; and means for providing said dot clock to said display control means.

* * * * *